US007851889B2

(12) United States Patent
Zhu et al.

(10) Patent No.: US 7,851,889 B2
(45) Date of Patent: Dec. 14, 2010

(54) MOSFET DEVICE INCLUDING A SOURCE WITH ALTERNATING P-TYPE AND N-TYPE REGIONS

(75) Inventors: Ronghua Zhu, Chandler, AZ (US); Amitava Bose, Tempe, AZ (US); Vishnu K. Khemka, Phoenix, AZ (US); Todd C. Roggenbauer, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 457 days.

(21) Appl. No.: 11/742,363

(22) Filed: Apr. 30, 2007

(65) Prior Publication Data

US 2008/0265291 A1 Oct. 30, 2008

(51) Int. Cl.
*H01L 21/00* (2006.01)
(52) U.S. Cl. ............... 257/547; 257/401; 257/E29.04; 257/E29.12
(58) Field of Classification Search ............... 257/331, 257/341, 401, E29.257, E23.079, E21.418, 257/547, 548, 550, E29.021, E29.039, E29.04, 257/E29.12
See application file for complete search history.

(56) References Cited

U.S. PATENT DOCUMENTS

| 6,066,878 | A | * | 5/2000 | Neilson | 257/342 |
|---|---|---|---|---|---|
| 6,121,089 | A | | 9/2000 | Zeng et al. | |
| 6,777,746 | B2 | * | 8/2004 | Kitagawa et al. | 257/335 |
| 6,900,109 | B2 | * | 5/2005 | Onishi et al. | 438/419 |
| 6,960,807 | B2 | | 11/2005 | Pendharkar | |
| 7,301,220 | B2 | * | 11/2007 | Udrea | 257/556 |
| 2002/0132406 | A1 | * | 9/2002 | Disney | 438/197 |
| 2003/0227052 | A1 | | 12/2003 | Ono et al. | |
| 2005/0012114 | A1 | | 1/2005 | Tada et al. | |
| 2005/0167742 | A1 | * | 8/2005 | Challa et al. | 257/328 |
| 2008/0296669 | A1 | * | 12/2008 | Pendharkar et al. | 257/329 |

OTHER PUBLICATIONS

Hower, P., et al., A rugged LDMOS for LBC5 Technology, Proceedings on the 17th International Symposium on Power Semiconductor Devices & IC's, May 23-26, 2005.
Williams, R., et al., The Influence of N+ Source Region on Parasitic PNP Conduction In Integrated N- Channel DMOS, Proceedings of the 6th International Symposium on Volume, Issue, May 31-Jun. 3, 1994 pp. 143-148.
International Search Report for coordinating PCT Application No. PCT/US2008/060397 mailed Sep. 24, 2008.

* cited by examiner

*Primary Examiner*—Matthew S Smith
*Assistant Examiner*—Quovaunda Jefferson
(74) *Attorney, Agent, or Firm*—Ingrassia, Fisher & Lorenz, P.C.

(57) ABSTRACT

Apparatus and methods are provided for fabricating semiconductor devices with reduced bipolar effects. One apparatus includes a semiconductor body (120) including a surface and a transistor source (300) located in the semiconductor body proximate the surface, and the transistor source includes an area (310) of alternating conductivity regions (3110, 3120). Another apparatus includes a semiconductor body (120) including a first conductivity and a transistor source (500) located in the semiconductor body. The transistor source includes multiple regions (5120) including a second conductivity, wherein the regions and the semiconductor body form an area (510) of alternating regions of the first and second conductivities. One method includes implanting a semiconductor well (120) including a first conductivity in a substrate (110) and implanting a plurality of doped regions (5120) comprising a second conductivity in the semiconductor well. An area (510) comprising regions of alternating conductivities is then formed in the semiconductor well.

20 Claims, 6 Drawing Sheets

MOSFET DEVICE INCLUDING A SOURCE WITH ALTERNATING P-TYPE AND N-TYPE REGIONS

FIELD OF THE INVENTION

The present invention generally relates to semiconductor devices and methods for fabricating semiconductor devices, and more particularly relates to semiconductor devices embodying a source including positive regions interdigitated with negative regions.

BACKGROUND OF THE INVENTION

A metal oxide semiconductor field-effect transistor (MOSFET) device operates by virtue of a field controlled channel established in a semiconductor body or surface. MOSFET devices come in a wide variety of forms and employ other materials besides simple metals and oxides. Persons of skill in the art understand that the word "metal" in the term MOSFET refers to any form of an electrically conductive material (e.g., simple metals, polysilicon, metal alloys, semi-metals, mixtures, semiconductors, conductive organics, conductive silicides, conductive nitrides, and the like). Accordingly, the terms "metal" and "silicide" as used herein are intended to include such variations as well as other suitable conductors.

A wide variety of semiconductors may be used for forming MOSFET devices (e.g., types IV, III-V and II-VI semiconductors, organic semiconductors, layered structures, etc.) such as, for example, semiconductor-on-insulator (SOI) structures. Accordingly, the term "semiconductor" is intended to include these and other materials, and arrangements suitable for forming field controlled devices. Persons of skill in the art further understand that the word "oxide" in the label MOSFET stands for any of a large number of insulating dielectrics, and is not limited merely to oxides. Accordingly, the terms metal, oxide, semiconductor, and MOSFET are intended to include these and other variations.

Further, MOSFET devices may be formed with a p-type or an n-type channel (P-channel and N-channel, respectively), depending upon the conductivity type of the various semiconductor regions and/or the polarity of the control voltage. Furthermore, MOSFET devices may function as enhancement mode or depletion mode devices depending upon the threshold voltage of the MOSFET device. For convenience of explanation, and not intended to be limiting, the various embodiments described herein relate to N-channel MOSFET devices. However, persons of skill in the art will understand that P-channel MOSFET devices may be obtained by interchanging the various P-regions and N-regions of the disclosed MOSFET devices. That is, N-type regions replaced by P-type regions, and P-type regions replaced by N-type regions. Accordingly, the description herein of N-channel MOSFET devices serves to illustrate either N-channel or P-channel devices, and the identification of particular regions of the device as being N-type or P-type may be replaced by the more general terms "first conductivity type" or "second, opposite, conductivity type," where the "first conductivity type" may be either an N-type or a P-type, and the "second, opposite, conductivity type" will then be a P-type or N type, respectively, the choice depending upon what type of MOSFET device (N-channel or P-channel) is desired.

Conventional MOSFET devices may inherently include parasitic bipolar devices. While such parasitic bipolar devices may not interfere significantly with operation of the MOSFET device under many operating conditions, the existence of parasitic bipolar devices may significantly degrade the properties of a MOSFET device operating at voltage and/or current extremes. The inclusion of parasitic bipolar devices sometimes provides a MOSFET device safe operating area (SOA) that is smaller than desired and/or the MOSFET device may be more susceptible to transient stress failure.

As an example, FIG. 1 illustrates a schematic of a conventional N-channel MOSFET device 100. N-channel MOSFET device 100 includes a p-type substrate 110 (P-substrate) formed of, for example, silicon and having surface 1110. P-substrate 110 also includes a negative well 115 (N-well) and a positive well 120 (P-well) formed in P-substrate 110. Dielectric isolation regions 125 and 130 (e.g., silicon oxide) are also formed in surface 1110 of P-substrate 110. A highly doped negative (N+) source region 135 is formed in P-well 120 and an N+ drain region 140 is formed in N-well region 115. N+ source region 135 and N+ drain region 140 are spaced apart in surface 1110. N+ drain region 140 is proximate dielectric isolation region 125 on the opposite side thereof from N+ source region 135. A gate dielectric 1510 (e.g., silicon oxide) is formed on surface 1110 and a gate 150 (e.g., doped polysilicon) is provided overlying gate dielectric 1510. Gate 150 is located so as to be above a portion of P-well 120 proximate source 135, and in this example, also above a portion 1115 of P-substrate 110, and also extending above a portion 1150 of N-well region 115 to isolation region 125. In this example, portion 1115 of P-substrate 110 extends to surface 1110, but this is not essential, and P-well 120 and N-well region 115 may abut; that is, without portion 1115 there between. A highly doped positive (P+) ohmic body contact 160 is provided to P-well 120, which in turn is in ohmic contact with P-substrate 110.

An electrode 165 is provided in ohmic electrical contact with N+ drain region 140. Another electrode 167 is provided in ohmic electrical contact with gate 150. Yet another electrode 170 is provided in ohmic electrical contact with N+ source region 135 and P+ ohmic body contact 160. P+ ohmic body contact 160 and N+ source region 135 are generally shorted together by electrode 170, although this is not essential. When appropriately biased, a source-drain current ($I_{s/d}$) 180 flows from N+ source region 135 through an N-channel 185 in P-well 120, (and P-substrate 110 if a portion thereof extends to surface 1110) into N-well region 115, and under dielectric isolation region 125 to N+ drain region 140.

FIG. 2 shows an example of a schematic diagram of an equivalent circuit of N-channel MOSFET device 100 (see FIG. 1) having a parasitic bipolar device 200 therein when N-channel MOSFET device 100 is operating under a high-voltage and high-current condition. With assistance from current $I_d$ 180 flowing through N-well region 115, an avalanche electron-hole pair generation region 195 may form proximate N+ drain region 140 and adjacent to dielectric isolation region 125. While hot electrons flow to and are collected by N+ drain region 140, hot holes flow to P+ ohmic body contact 160 through a finite resistance 198, under N+source region 135, and forms $I_p$ 199. The portion of P-well 120 beneath N+ source region 135 through which $I_p$ 199 passes has a finite resistance 198, which provides a base-emitter bias to parasitic bipolar device 200. Since $I_{s/d}$ 180 is an electron current and $I_p$ 199 is a hole current, the total current ($I_{total}$) between electrodes 170 and 165 is the sum of the magnitude of the two currents; that is, $|I_{total}|=|I_{s/d}|+|I_p|$.

Under certain operating conditions, positive feedback may occur in N-channel MOSFET device 100. Positive feedback may cause $I_{total}$ to rapidly increase, which leads to premature device instability and/or failure. As a consequence of the existence of parasitic bipolar device 200, the properties of N-channel MOSFET device 100 may be degraded, especially the safe operating area (SOA) and/or the ability of N-channel MOSFET device 100 to resist destructive damage due to transient currents.

It has been discovered that adverse consequences of parasitic bipolar device 200, which is inherently associated with many MOSFET devices, are reduced by adopting a source including interdigitated, interwoven, or alternating P+/N+ regions. Accordingly, it is desirable to provide a MOSFET device with a source including interdigitated, interwoven, or alternating P+/N+ regions. In addition, it is desirable to provide a MOSFET device with improved operating characteristics, and more particularly, MOSFET devices with an enhanced SOA, reduced size, and a greater manufacturing yield. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, or the following detailed description.

Various exemplary embodiments provide a semiconductor device (e.g., device 100 of FIG. 1) comprising a source configuration capable of improving the safe operating area of device 100 by reducing the parasitic effects of a bipolar device (e.g., parasitic bipolar device 200). The semiconductor device may operate with current values up to about 10 amps, voltages in the range of about 40 volts to about 100 volts, and power values up to about 1000 watts.

Figure 1:
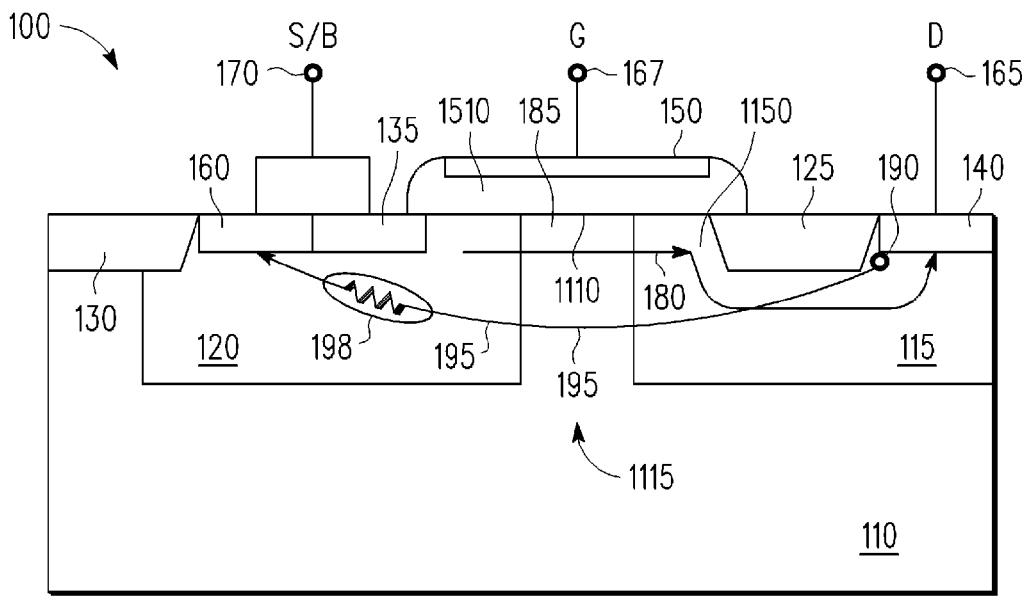
FIG. 1 is a schematic diagram of a prior art semiconductor device.
Figure 2:
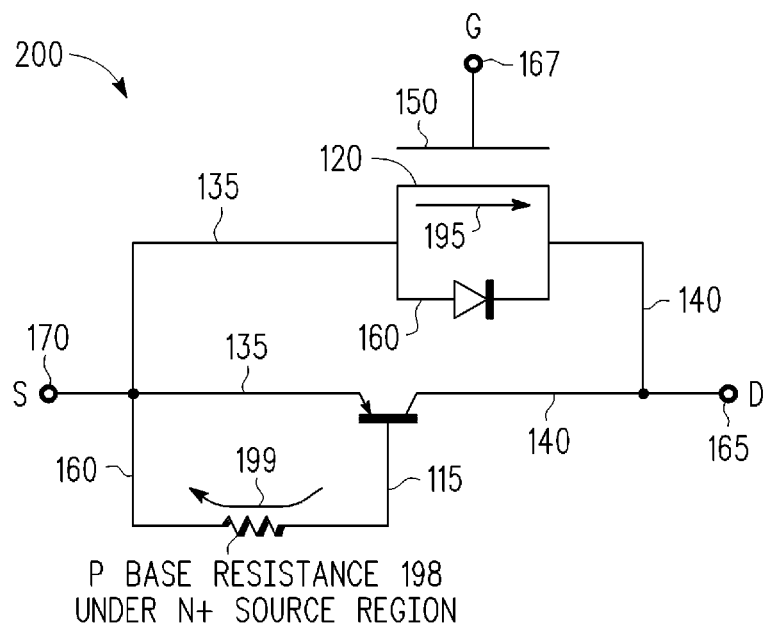
FIG. 2 is a schematic circuit diagram of the semiconductor device of FIG. 1, illustrating a parasitic bipolar device that may exist in such structure.
Figure 3:
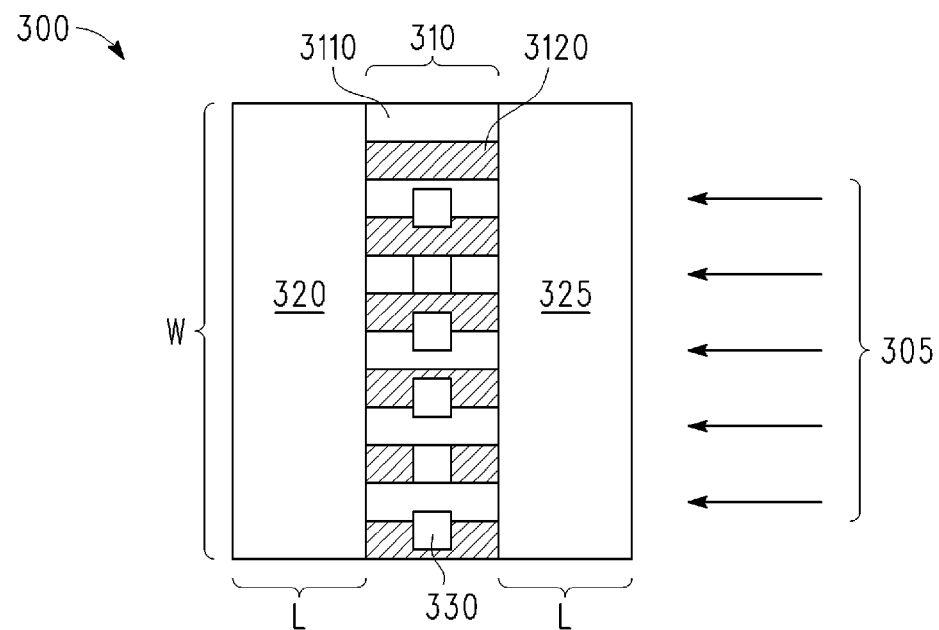
FIG. 3 is a schematic diagram of one exemplary embodiment of a portion of a semiconductor device comprising a transistor source with alternating conductivity regions.

FIG. 3 is a schematic diagram of one exemplary embodiment of a portion (e.g., a transistor source) 300 comprising at least one area 310 comprised of alternating conductivity regions replacing source 135 and P+ ohmic body contact 160 of semiconductor device 100 (see FIG. 1). Each area 310 comprises one or more highly-doped positive (P+) regions 3110 and one or more highly-doped negative (N+) regions 3120. As illustrated, P+ regions 3110 and N+ regions 3120 are aligned substantially parallel to one another and interdigitated along the device width direction, while current flow 305 is along the device length direction (e.g., the poly gate length direction).

Suitable materials for P+ regions 3110 include, but are not limited to, silicon, germanium, gallium arsenide, silicon carbide, and the like semiconductor materials doped with, for example, boron, aluminum, gallium, indium, germanium, and the like dopants. The doped silicon, germanium, gallium arsenide, or silicon carbide comprises a doping concentration in the range of about $1 \times 10^{20}$ cm$^{-3}$ to about $5 \times 10^{21}$ cm$^{-3}$.

P+ regions 3110 may also include any suitable shape (e.g., rectangular, square, rhombus, circular, oval, etc.) with corresponding dimensions. For example, P+ regions 3110 may include, but are not limited to, a junction depth in the range of about 0.05 μm to about 0.5 μm, a width in the range of about 0.2 μm to about 1.0 μm, and a length in the range of about 0.2 μm to about 1.0 μm.

Suitable materials for N+ regions 3120 include, but are not limited to, silicon, germanium, gallium arsenide, and the like semiconductor materials doped with, for example, arsenic, phosphorous, antimony, and the like dopants. The doped silicon, germanium, or gallium arsenide comprises a doping concentration in the range of about $1 \times 10^{20}$ cm$^{-3}$ to about $5 \times 10^{21}$ cm$^{-3}$.

N+ regions 3120 may include any suitable shape (e.g., rectangular, square, rhombus, circular, oval, etc.) with corresponding dimensions. For example, N+ regions 3120 may include, but are not limited to, a junction depth in the range of about 0.05 μm to about 0.5 μm, a width in the range of about 0.2 μm to about 1.0 μm, and a length in the range of about 0.2 μm to about 1.0 μm.

The junction formed by P+ regions 3110 and N+ regions 3120 are shorted to control/limit the flow of electrons or holes through area 310. To short P+ regions 3110 and N+ regions 3120, a silicide layer may be formed on top of the alternating P+ regions 3110 and N+ regions 3120 of area 310, although other shorting techniques are contemplated.

Transistor source 300 also comprises a polysilicon region 320 and/or a polysilicon region 325 adjacent to area 310. Polysilicon regions 320 and 325 may include any shape with a length along the current flow direction.

As illustrated in FIG. 3, for example, polysilicon regions 320 and 325 include a rectangular shape having a width "W" and a length "L." Furthermore, FIG. 3 illustrates that width W is substantially perpendicular to the flow of current 305 and length L is along the flow of current 305.

Polysilicon regions 320 and 325 may also include any suitable dimensions. For example, polysilicon regions 320 and 325 may include, but are not limited to, a width in the range of about 1.0 μm to about 1000 μm and a length in the range of about 0.5 μm to about 10.0 μM.

Transistor source 300 also includes one or more source contacts 330 located within area 310. Source contacts 330 may be formed of any conductive material, and may include any shape suitable for use in semiconductor device 100.

Figure 4:
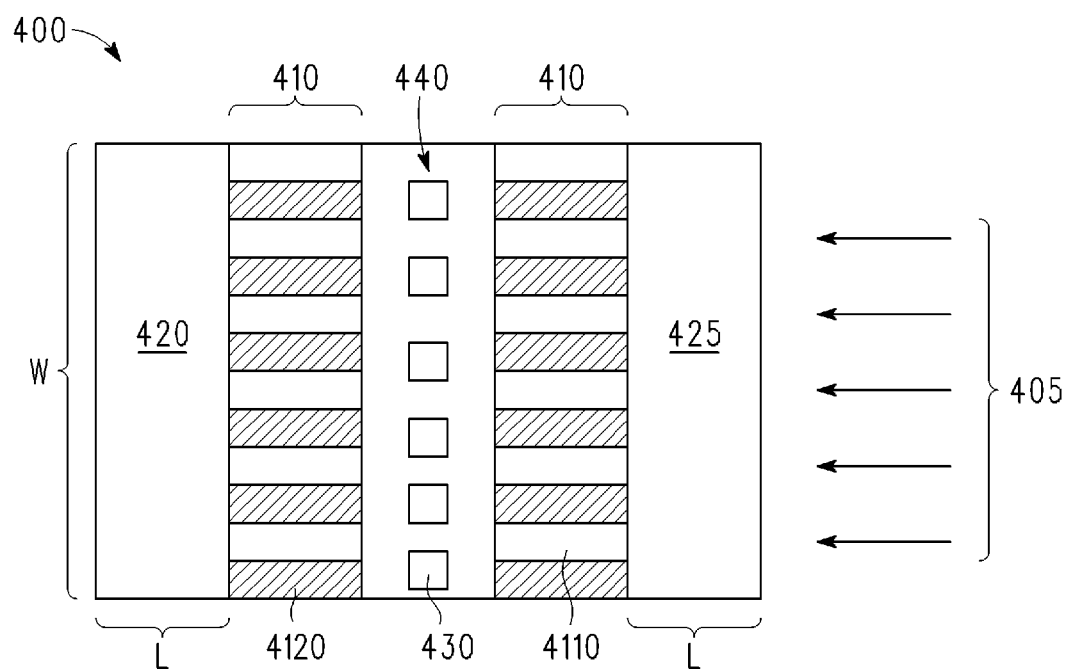
FIG. 4 is a schematic diagram of another exemplary embodiment of a portion of a semiconductor device comprising a transistor source with alternating conductivity regions.

FIG. 4 is a schematic diagram of one exemplary embodiment of a portion (e.g., a transistor source) 400 comprising at least one area 410 comprised of alternating conductivity regions replacing source 135 and P+ ohmic body contact 160 of semiconductor device 100 (see FIG. 1). Each area 410 comprises one or more P+ regions 4110 and one or more N+ regions 4120 similar to P+ regions 3110 and N+ regions 3120 of area 310 (see FIG. 3). As illustrated, P+ regions 4110 and N+ regions 4120 are aligned substantially parallel to one another and interdigitated along the device width direction, while current flow 405 is along the device length direction (e.g., the poly gate length direction).

Suitable materials for P+ regions 4110 include, but are not limited to, silicon, germanium, gallium arsenide, silicon carbide, and the like semiconductor materials doped with, for example, boron, aluminum, gallium, indium, germanium, and the like dopants. The doped silicon, germanium, gallium arsenide, or silicon carbide comprises a doping concentration in the range of about $1\times10^{20}$ cm$^{-3}$ to about $5\times10^{21}$ cm$^{-3}$.

P+ regions 4110 may also include any suitable shape (e.g., rectangular, square, rhombus, circular, oval, etc.) with corresponding dimensions. For example, P+ regions 4110 may include, but are not limited to, a junction depth in the range of about 0.05 μm to about 0.5 μm, a width in the range of about 0.2 μm to about 1.0 μm, and a length in the range of about 0.2 μm to about 1.0 μm.

Suitable materials for N+ regions 4120 include, but are not limited to, silicon, germanium, gallium arsenide, and the like semiconductor materials doped with, for example, arsenic, phosphorous, antimony, and the like dopants. The doped silicon, germanium, or gallium arsenide comprises a doping concentration in the range of about $1\times10^{20}$ cm$^{-3}$ to about $5\times10^{21}$ cm$^{-3}$.

N+ regions 4120 may also include any suitable shape (e.g., rectangular, square, rhombus, circular, oval, etc.) with corresponding dimensions. For example, N+ regions 4120 may include, but are not limited to, a junction depth in the range of about 0.05 μm to about 0.5 μm, a width in the range of about 0.2 μm to about 1.0 μm, and a length in the range of about 0.2 μm to about 1.0 μm.

The junction regions formed by P+ regions 4110 and N+ regions 4120 are shorted to control/limit the flow of electrons or holes through area 410. To short P+ regions 4110 and N+ regions 4120, a silicide layer may be formed on top of the alternating P+ regions 4110 and N+ regions 4120 of area 410, although other shorting techniques are contemplated.

Transistor source 400 also comprises a polysilicon region 420 and/or a polysilicon region 425 (similar to polysilicon regions 320 and 325 (see FIG. 3)) adjacent to at least one area 410. Polysilicon regions 420 and 425 may include any shape and are formed substantially parallel to each area 410 with respect to the gate length direction of transistor source 400.

As illustrated in FIG. 4, for example, polysilicon regions 420 and 425 include a rectangular shape having a width "W" and a length "L." Furthermore, FIG. 4 illustrates that width W is substantially perpendicular to the flow of current 405 and length L is along the flow of current 405.

Polysilicon regions 420 and 425 may also include any suitable dimensions. For example, polysilicon regions 420 and 425 may include, but are not limited to, a width in the range of about 1.0 μm to about 1000 μm and a length in the range of about 0.5 μm to about 10.0 μM.

Transistor source 400 also includes a P+ region 440 formed between areas 410. P+ region 440 is comprised of substantially the same material(s) and comprises substantially the same doping concentration as P+ regions 4110. P+ region 440 may also include any suitable shape (e.g., rectangular, square, rhombus, circular, oval, etc.) with corresponding dimensions.

One or more source contacts 430 located within P+ region 440 are also included on transistor source 400. Source contacts 430 may be formed of any conductive material, and may include any shape suitable for use in semiconductor device 100.

Figure 5:
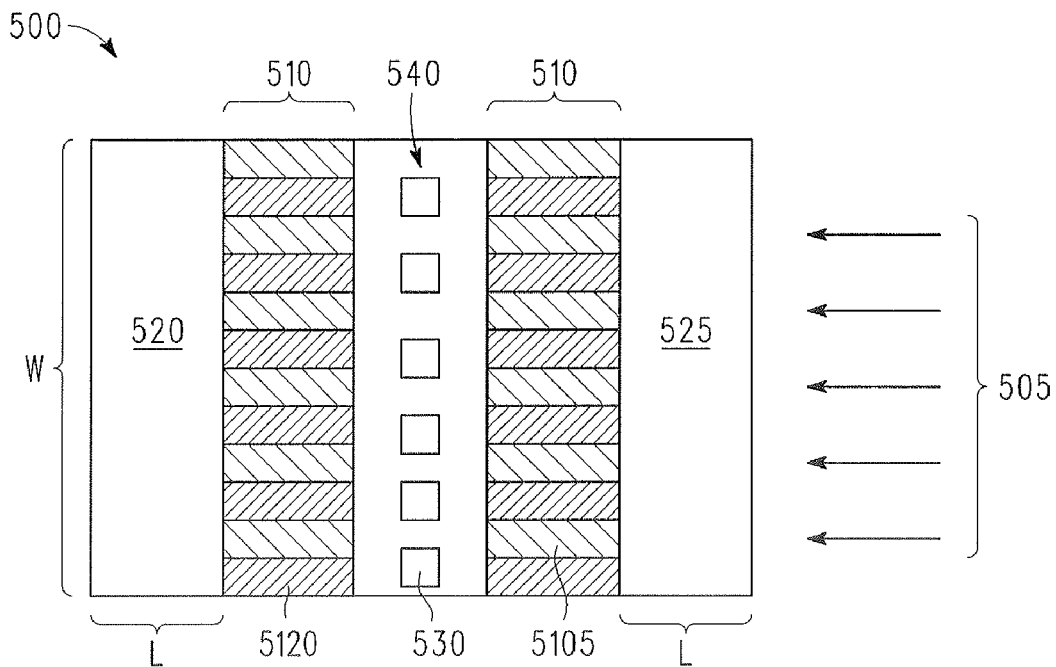
FIG. 5 is a schematic diagram of yet another exemplary embodiment a portion of a semiconductor device comprising a transistor source with alternating conductivity regions.

FIG. 5 is a schematic diagram of one exemplary embodiment of a portion 500 (e.g., a transistor source) comprising at least one area 510 comprised of alternating conductivity regions replacing source 135 and P+ ohmic body contact 160 of semiconductor device 100 (see FIG. 1). Each area 510 comprises one or more P-well regions (e.g., high voltage regions of P-well 120 (see FIG. 1)) 5105 and one or more N+ regions 5120. As illustrated, P-well regions 5105 and N+ regions 5120 are aligned substantially parallel to one another and are interdigitated along the device width direction, while current flow 505 is along the device length direction (e.g., the poly gate length direction).

Suitable materials for P-well regions 5105 (and P-well 120) include, but are not limited to, silicon, germanium, gallium arsenide, silicon carbide, and the like semiconductor materials doped with, for example, boron, aluminum, gallium, indium, germanium, and the like dopants. The doped silicon, germanium, gallium arsenide, or silicon carbide comprises a doping concentration in the range of about $3\times10^{16}$ cm$^{-3}$ to about $5\times10^{17}$ cm$^{-3}$.

P-well regions 5105 may also include any suitable shape (e.g., rectangular, square, rhombus, circular, oval, etc.) with corresponding dimensions. For example, P-well regions 5105 may include, but are not limited to, a junction depth in the range of about 0.5 μm to about 3.5 μm, a width in the range of about 1.0 μm to about 1000 μm, and a length in the range of about 0.5 μm to about 5.0 μm.

Suitable materials for N+ regions 5120 include, but are not limited to, silicon, germanium, gallium arsenide, and the like semiconductor materials doped with, for example, arsenic, phosphorous, antimony, and the like dopants. The doped silicon, germanium, or gallium arsenide comprises a doping concentration in the range of about $1\times10^{20}$ cm$^{-3}$ to about $5\times10^{21}$ cm$^{-3}$.

N+ regions 5120 may include any suitable shape (e.g., rectangular, square, rhombus, circular, oval, etc.) with corresponding dimensions. For example, N+ regions 5120 may include, but are not limited to, a junction depth in the range of about 0.05 μm to about 0.5 μm, a width in the range of about 0.2 μm to about 1.0 μm, and a length in the range of about 0.2 μm to about 1.0 μm.

The P-well regions 5105 and N+ regions 5120 are shorted to control/limit the flow of electrons or holes through area 510. To short P-well regions 5105 and N+ regions 5120, a silicide layer may be formed on top of the alternating P-well regions 5105 and N+ regions 5120 of area 510, although other shorting techniques are contemplated.

Transistor source 500 also comprises a polysilicon region 520 and/or a polysilicon region 525 (similar to polysilicon regions 320 and 325 (see FIG. 3)) adjacent to at least one area 510. Polysilicon regions 520 and 525 may include any shape with a length along the direction of current flow 505.

As illustrated in FIG. 5, for example, polysilicon regions 520 and 525 include a rectangular shape having a width "W"

and a length "L." Furthermore, FIG. 5 illustrates that width W is substantially perpendicular to current flow 505 and length L is along current flow 505.

Polysilicon regions 520 and 525 may also include any suitable dimensions. For example, polysilicon regions 520 and 525 may include, but are not limited to, a width in the range of about 1.0 µm to about 1000 µm and a length in the range of about 0.5 µm to about 10.0 µM.

Transistor source 500 also comprises a P+ region 540 formed between areas 510. P+ region 540 is comprised of substantially the same material(s) and comprises substantially the same doping concentration as P-well regions 5105. P+ region 540 may also include any suitable shape (e.g., rectangular, square, rhombus, circular, oval, etc.) with corresponding dimensions.

One or more source contacts 530 located within P+ region 540 are also included on transistor source 500. Source contacts 530 may be formed of any conductive material, and may include any shape suitable for use in semiconductor device 100.

Figure 6:
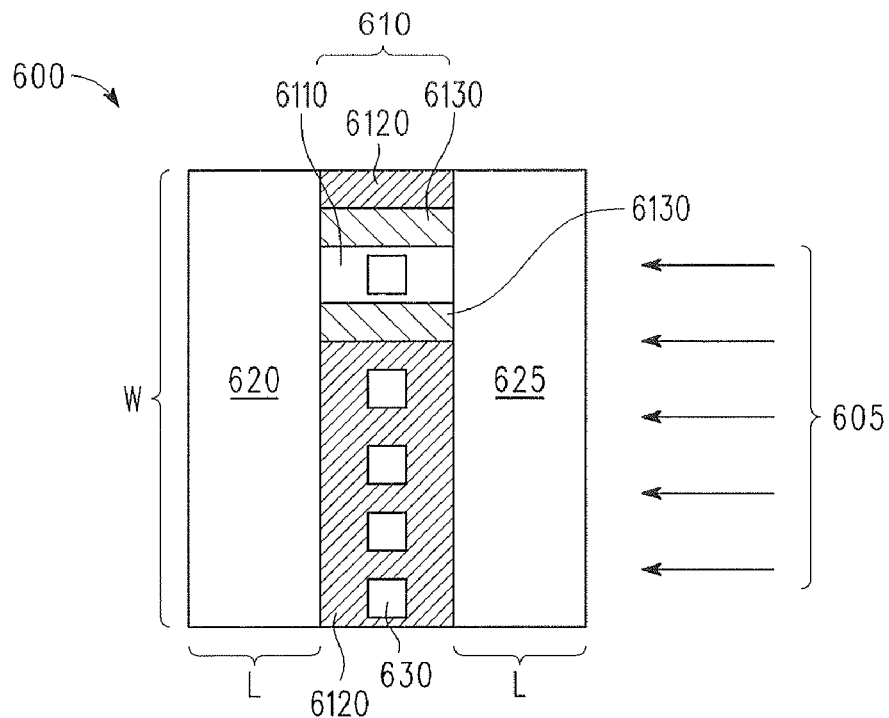
FIG. 6 is a schematic diagram of one embodiment of a portion of a semiconductor device comprising a transistor source with a silicided block region between conductivity regions.

Turning now to FIG. 6, there are times when the P+ and N+ regions of the source need to be biased separately. To separately bias the P+ and N+ regions, a silicided block region may be used to isolate the P+ and N+ regions from one another so that the junction between the P+ and N+ regions will not be shorted.

FIG. 6 is a schematic diagram of one exemplary embodiment of a portion (e.g., a transistor source) 600 comprising at least one area 610 comprised of alternating conductivity regions replacing source 135 and P+ ohmic body contact 160 of semiconductor device 100 (see FIG. 1). Each area 610 comprises one or more P+ regions 6110, one or more N+ regions 6120, and one or more silicided block regions 6130 separating each P+ region 6110 and N+ region to form alternating P+/silicided block/N+ regions or alternating N+/silicided block/P+ regions. As illustrated, P+ region 6110, N+ region 6120, and silicided block region 6130 are aligned substantially parallel to one another and interdigitated along the device width while current flow 605 is along the device length direction (e.g., the poly gate length direction).

Suitable materials for P+ regions 6110 include, but are not limited to, silicon, germanium, gallium arsenide, silicon carbide, and the like semiconductor materials doped with, for example, boron, aluminum, gallium, indium, germanium, and the like dopants. The doped silicon, germanium, gallium arsenide, or silicon carbide comprises a doping concentration in the range of about $6\times10^{16}$ cm$^{-3}$ to about $5\times10^{17}$ cm$^{-3}$.

Furthermore, P+ regions 6110 may include any suitable shape (e.g., rectangular, square, rhombus, circular, oval, etc.) with corresponding dimensions. For example, P+ regions 6110 may include, but are not limited to, a junction depth in the range of about 0.05 µm to about 0.5 µm, a width in the range of about 0.2 µm to about 1.0 µm, and a length in the range of about 0.2 µm to about 1.0 µm.

Suitable materials for N+ regions 6120 include, but are not limited to, silicon, germanium, gallium arsenide, and the like semiconductor materials doped with, for example, arsenic, phosphorous, antimony, and the like dopants. The doped silicon, germanium, or gallium arsenide comprises a doping concentration in the range of about $6\times10^{16}$ cm$^{-3}$ to about $5\times10^{17}$ cm$^{-3}$.

N+ regions 6120 may include any suitable shape (e.g., rectangular, square, rhombus, circular, oval, etc.) with corresponding dimensions. For example, N+ regions 6120 may include, but are not limited to, a junction depth in the range of about 0.05 µm to about 0.5 µm, a width in the range of about 0.2 µm to about 1.0 µm, and a length in the range of about 0.2 µm to about 1.0 µm.

Silicided block region 6130 may include any suitable shape (e.g., rectangular, square, rhombus, circular, oval, etc.) with corresponding dimensions. For example, silicided block region 6130 may include, but is not limited to, a film thickness in the range of about 10 nm to about 100 nm. Furthermore, silicided block 6130 may be formed of any insulating material including, for example, silicon dioxide ($SiO_2$), silicon nitride ($Si_3N_4$), a combination of $SiO_2$ and $Si_3N_4$, and the like insulating materials.

Transistor source 600 also comprises a polysilicon region 620 and/or a polysilicon region 625 adjacent to at least one area 610. Polysilicon regions 620 and 625 may include any shape with a length along the direction of current flow 605.

As illustrated in FIG. 6, polysilicon regions 620 and 625 include a rectangular shape having a width "W" and a length "L." Furthermore, FIG. 6 illustrates that width W is substantially perpendicular to the flow of current 605 and length L is along the flow of current 605.

Polysilicon regions 620 and 625 may include any suitable dimensions. For example, polysilicon regions 620 and 625 include, but are not limited to, a width in the range of about 1.0 µm to about 1000 µm and a length in the range of about 0.5 µm to about 10.0 µM.

Transistor source 600 also includes one or more source contacts 630 located within area 610. Source contacts 630 may be formed of any conductive material, and may include any shape suitable for use in semiconductor device 100.

Figure 7:
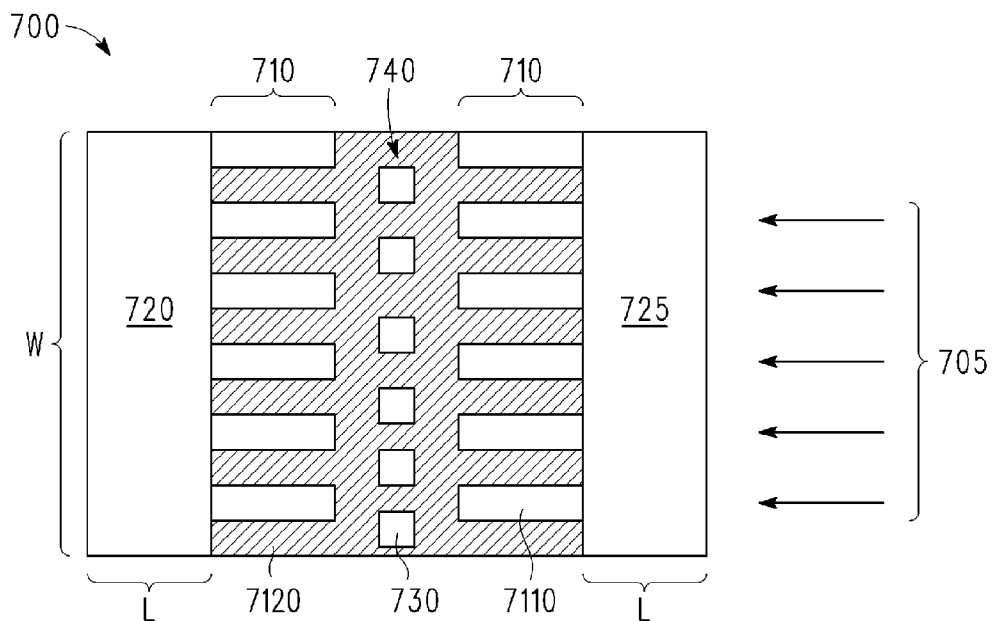
FIG. 7 is a schematic diagram of another exemplary embodiment the portion of the semiconductor device of FIG. 4 with the opposite conductivity.

FIG. 7 is a schematic diagram of transistor source 400 (see FIG. 4) with the opposite conductivity (hereinafter transistor source 700). That is, transistor source 700 is formed in an N-well source (e.g., N-well 115 configured as a source) instead of P-well 120.

Furthermore, transistor source 700 also comprises an N+ region 740 formed between areas 710 instead of P+ region 440. N+ region 740 is comprised of substantially the same material(s) and comprises substantially the same doping concentration as the underlying N-well. N+ region 740 may also include any suitable shape (e.g., rectangular, square, rhombus, circular, oval, etc.) with corresponding dimensions.

Therefore, various embodiments of transistor sources 300, 400, 500, and 600 (see FIGS. 3, 4, 5, and 6, respectively) comprise the opposite conductivity than that explicitly disclosed herein. That is, a p-type region or well in transistor sources 300, 400, 500, and 600 may be replaced with an n-type region or well, or vice-versa.

Figure 8:
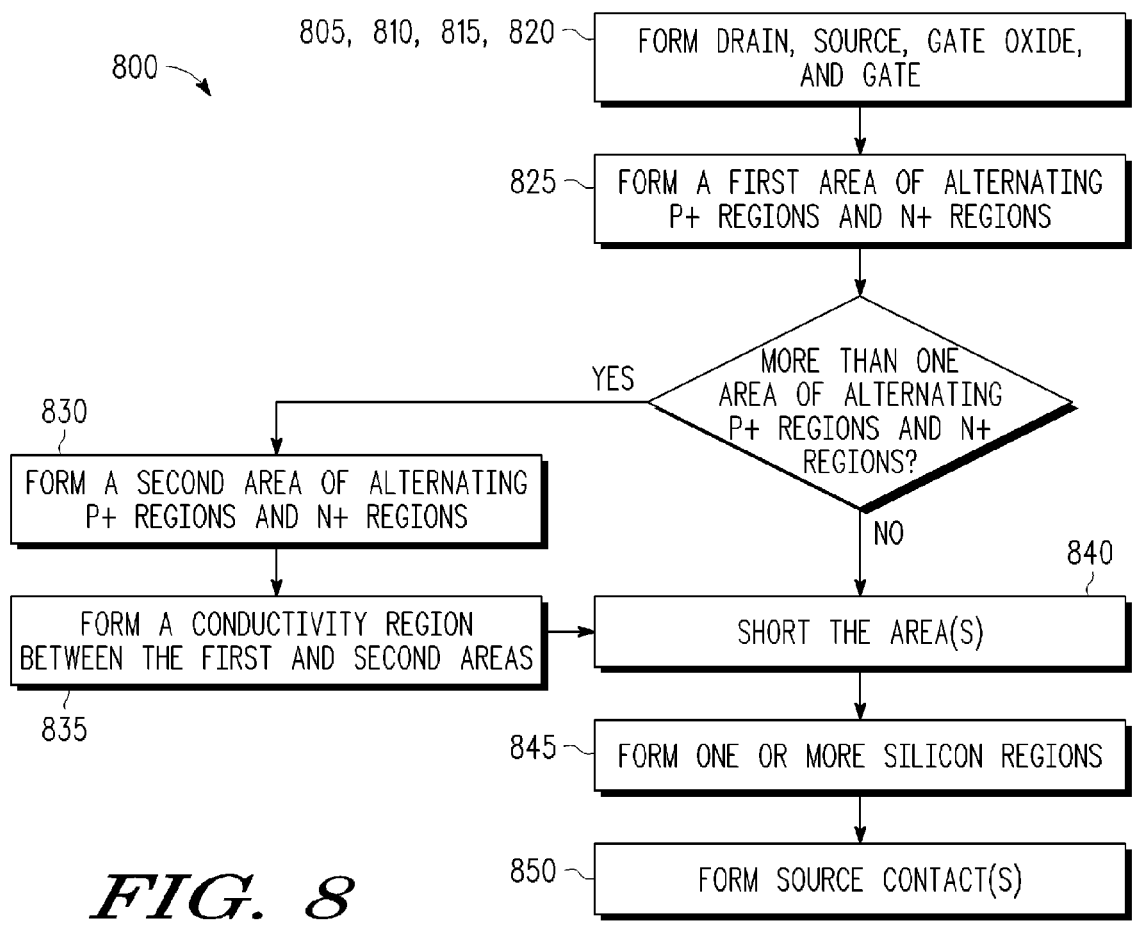
FIG. 8 is a flow diagram of one exemplary embodiment of a method for fabricating a semiconductor device comprising a transistor source with alternating conductivity regions.

FIG. 8 is a flow diagram of one exemplary embodiment of a method 800 for fabricating a semiconductor device (e.g., device 100 of FIG. 1) including a source (e.g., transistor sources 300 and 400) comprised of one or more areas (e.g., areas 310 and 410) of alternating positive regions (e.g., P+ regions 3110 and 4110) and N+ regions (e.g., N+ regions 3120 and 4120). Method 800 begins by forming a drain well (block 805) and a source well (block 810) in a substrate (e.g., P-substrate 110).

The source, in one embodiment, is an n-type well (e.g., N-well 115) and the drain is a p-type well (e.g., P-well 120). In another embodiment, the source is a p-type well (e.g., P-well 120) and the drain is an n-type well (e.g., N-well 115). Furthermore, the discussion below is made with reference to P-type devices; however, various embodiments of method 800 contemplate the fabrication of N-type devices. That is, reference to a p-type region or well may be replaced with an n-type region or well, or vice-versa.

A gate oxide (e.g., gate dielectric 1510) is grown on top of a respective portion of the substrate, the source, and the drain (block 815). A gate (e.g., gate 150) is then formed on the gate oxide (block 820).

A first area (e.g., areas 310 and 410) of alternating P+ regions (e.g., P+ regions 3110 and 4110) and N+ regions (e.g., N+ regions 3110 and 4110) is formed in the source (block 825). In one embodiment, a first plurality of P+ regions and a first plurality of N+ regions are implanted in the source using conventional implanting techniques. The alternating P+ regions and N+ regions are formed so that they are aligned substantially parallel to one another and interdigitated along the width of device 100 while current flow (e.g., current flows 305 and 405) is along the length of device 100 (e.g., the poly gate length direction).

If the source comprises more than one area of alternating P+ regions and N+ regions, subsequent area(s) of alternating P+ regions and N+ regions is/are similarly formed in the source (block 830). In embodiments comprising more than one area of alternating P+ regions and N+ regions, a conductivity region (e.g., P+ region 440) is also implanted between two areas of alternating P+ regions and N+ regions (block 835).

The area(s) of alternating P+ regions and N+ regions is/are then shorted (block 840). The area(s) may be shorted by, for example, depositing a silicide layer over the area(s) of alternating P+ regions and N+ regions, or by other known shorting techniques.

One or more polysilicon regions (e.g., polysilicon regions 320, 325, 420, and/or 425) is/are formed adjacent the area(s) of alternating P+ regions and N+ regions (block 845). In embodiments comprising a single area of alternating P+ regions and N+ regions, a polysilicon region is formed along each width W of the area. For embodiments comprising more than one area of alternating P+ regions and N+ regions, a polysilicon region is formed along the width W of the area opposite the conductivity region.

At least one source contact (e.g., source contacts 330 and 430) is/are formed in the source (block 850). In one exemplary embodiment, the source contact(s) is/are formed in the area of alternating P+ regions and N+ regions. The source contact(s), in another exemplary embodiment, are formed in the conductivity region separating the areas of alternating P+ regions and N+ regions.

Figure 9:
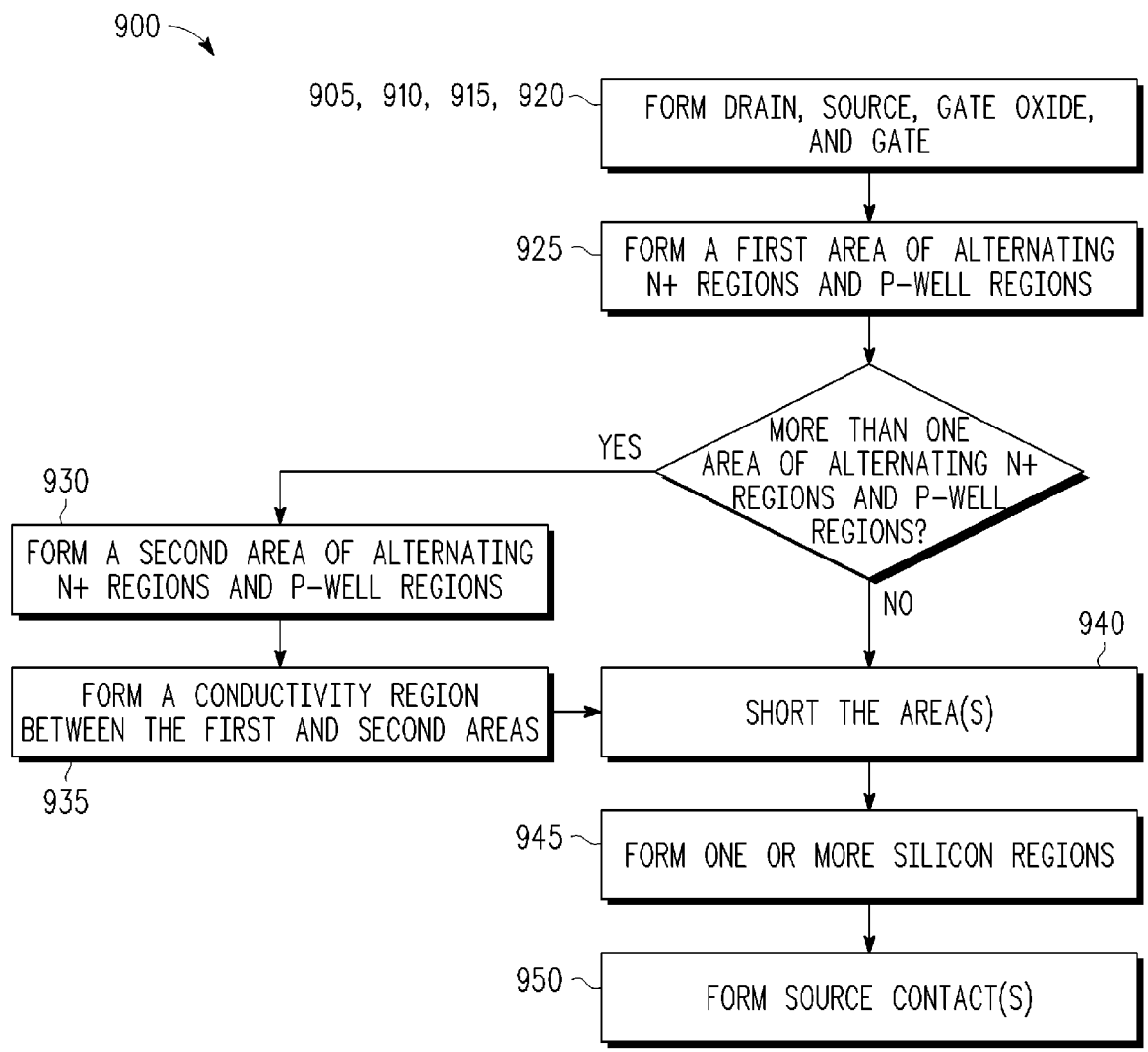
FIG. 9 is a flow diagram of another exemplary embodiment of a method for fabricating a semiconductor device comprising a transistor source with alternating conductivity regions.

FIG. 9 is a flow diagram of one exemplary embodiment of a method 900 for fabricating a semiconductor device (e.g., device 100 of FIG. 1) including a source (e.g., transistor source 500) comprised of one or more areas (e.g., 510) of alternating positive regions (e.g., P-well regions 5105) and N+ regions (e.g., N+ regions 5120). Method 900 begins by forming a drain well (block 905) and a source well (block 910) in a substrate (e.g., P-substrate 110).

The source, in one embodiment, is an n-type well (e.g., N-well 115) and the drain is a p-type well (e.g., P-well 120). In another embodiment, the source is a p-type well (e.g., P-well 120) and the drain is an n-type well (e.g., N-well 115). Furthermore, the discussion below is made with reference to P-type devices; however, various embodiments of method 900 contemplate the fabrication of N-type devices. That is, reference to a p-type region or well may be replaced with an n-type region or well, or vice-versa.

A gate oxide (e.g., gate dielectric 1510) is grown on top of a respective portion of the substrate, the source, and the drain (block 915). A gate (e.g., gate 150) is then formed on the gate oxide (block 920).

A first area (e.g., area 510) of alternating N+ regions (e.g., N+ regions 5110) and P-well regions (e.g., P-well regions 5105) is formed in the source (block 925). In one embodiment, the first plurality of N+ regions are implanted in the source using conventional implanting techniques. The N+ regions are formed so that they form the P-well regions between two N+ regions, and so that the N+ regions and P-well regions are aligned substantially parallel to one another and interdigitated along the width of device 100 while current flow (e.g., current flow 505) is along the length of device 100 (e.g., the poly gate length direction).

If the source comprises more than one area of alternating N+ regions and P-well regions, subsequent area(s) of alternating N+ regions and P-well regions is/are similarly formed in the source (block 930). In embodiments comprising more than one area of alternating N+ regions and P-well regions, a conductivity region (e.g., P+ region 540) is also implanted between two areas of alternating N+ regions and P-well regions (block 935).

The area(s) of alternating N+ regions and P-well regions is/are then shorted (block 940). The area(s) may be shorted by, for example, depositing a silicide layer over the area(s) of alternating N+ regions and P-well regions, or by other known shorting techniques.

One or more polysilicon regions (e.g., polysilicon regions 520, and/or 525) is/are formed adjacent the area(s) of alternating N+ regions and P-well regions (block 945). In embodiments comprising a single area of alternating N+ regions and P-well regions, a polysilicon region is formed along each width W of the area. For embodiments comprising more than one area of alternating N+ regions and P-well regions, a polysilicon region is formed along the width W of the area opposite the conductivity region.

At least one source contact (e.g., source contacts 530) is/are formed in the source (block 950). In one exemplary embodiment, the source contact(s) is/are formed in the area of alternating N+ regions and P-well regions. The source contact(s), in another exemplary embodiment, are formed in the conductivity region separating the areas of alternating N+ regions and P-well regions.

Figure 10:
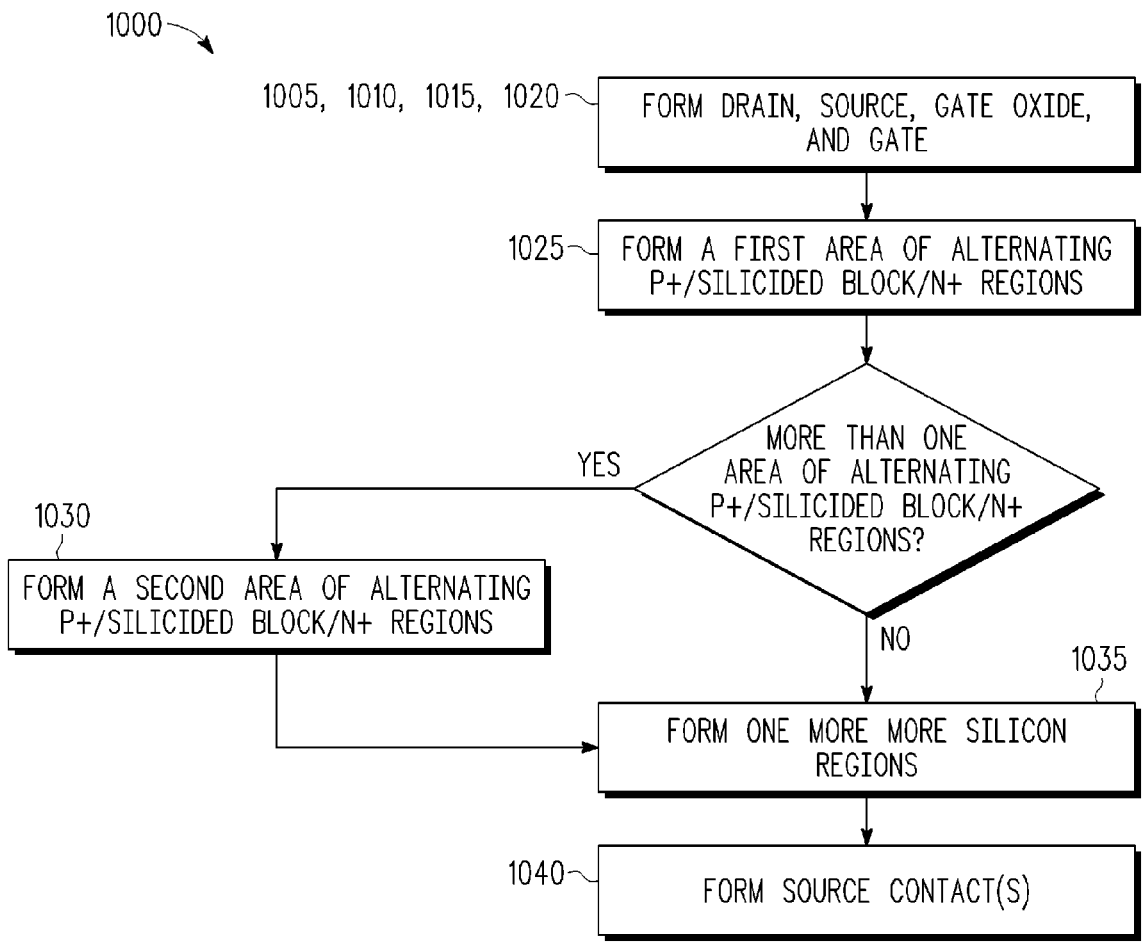
FIG. 10 is a flow diagram of yet another exemplary embodiment of a method for fabricating a semiconductor device comprising a transistor source with alternating conductivity regions.

FIG. 10 is a flow diagram of one exemplary embodiment of a method 1000 for fabricating a semiconductor device (e.g., device 100 of FIG. 1) including a source (e.g., transistor source 600) comprised of one or more areas (e.g., areas 610) of alternating positive regions (e.g., P+regions 6110), silicided block regions (e.g. silicided block regions 6130), and N+regions (e.g., N+regions 6120). Method 1000 begins by forming a drain well (block 1005) and a source well (block 1010) in a substrate (e.g., P-substrate 110).

The source, in one embodiment, is an n-type well (e.g., N-well 115) and the drain is a p-type well (e.g., P-well 120). In another embodiment, the source is a p-type well (e.g., P-well 120) and the drain is an n-type well (e.g., N-well 115). Furthermore, the discussion below is made with reference to P-type devices; however, various embodiments of method 1000 contemplate the fabrication of N-type devices. That is, reference to a p-type region or well may be replaced with an n-type region or well, or vice-versa.

A gate oxide (e.g., gate dielectric 1510) is grown on top of a respective portion of the substrate, the source, and the drain (block 1015). A gate (e.g., gate 150) is then formed on the gate oxide (block 1020).

A first area (e.g., areas 610) of alternating P+ regions, silicided block regions, and N+ regions is formed in the source (block 1025). In one embodiment, a first plurality of P+ regions and a first plurality of N+ regions are implanted in the source with a silicided block region formed between each P+ region and N+ regions using conventional techniques. The alternating P+/silicided block/N+ regions are formed so that they are aligned substantially parallel to one another and interdigitated along the width of device 100 while current flow (e.g., current flows 605) is along the length of device 100 (e.g., the poly gate length direction). If the source comprises more than one area of alternating P+/silicided block/N+ regions, subsequent area(s) is/are similarly formed in the source (block 1030).

One or more polysilicon regions (e.g., polysilicon regions 620, and/or 625) is/are formed adjacent the area(s) of alternating P+/silicided block/N+ regions (block 1035). In embodiments comprising a single area of alternating P+/silicided block/N+ regions, a polysilicon region is formed along each width W of the area. For embodiments comprising more than one area of alternating P+/silicided block/N+ regions, a polysilicon region is formed along the width W of the area opposite the conductivity region.

At least one source contact (e.g., source contacts 630) is/are formed in the source (block 1040). In one exemplary embodiment, the source contact(s) is/are formed in the area of alternating P+/silicided block/N+ regions. The source contact (s), in another exemplary embodiment, are formed in the conductivity region separating the areas of alternating P+/silicided block/N+ regions.

In summary, various embodiments provide semiconductor device comprising a semiconductor body comprising a surface, a transistor source located in the semiconductor body proximate the surface, and a first area comprising alternating p-type regions and n-type regions located in the transistor source. In one embodiment, the source further comprises a silicide layer covering at least a portion of the first area. In another embodiment, the first area comprises a silicided block region separating a p-type region from an n-type region. In still another embodiment, the semiconductor device further comprises a first polysilicon region located in the transistor source, and a second polysilicon region located in the transistor source, the first area separating the first and second polysilicon regions.

The semiconductor device, in another embodiment, further comprises a second area comprising alternating p-type regions and n-type regions located in the transistor source. In yet another embodiment, the source further comprises one of a p-type region and an n-type region separating the first area and the second area. In one embodiment, a first polysilicon region is located adjacent the first area, and a second polysilicon region may also be located adjacent the second area.

Another semiconductor device comprises a semiconductor body comprising a surface and a first conductivity type, a transistor source located in the semiconductor body proximate the surface, and a first plurality of regions comprising a second conductivity type located in the transistor source. In one embodiment, the first plurality of regions and the semiconductor body form a first area of alternating regions of the first and second conductivity types.

In an exemplary embodiment, the semiconductor device further comprises a second plurality of regions comprising the second conductivity type located in the semiconductor body. In this embodiment, the second plurality of regions and the semiconductor body form a second area of alternating regions of the first and second conductivity types.

The semiconductor device, in another exemplary embodiment, further comprises a doped region comprising one of the first conductivity type and the second conductivity type separating the first and second areas. In one embodiment, the first conductivity type is an n-type conductivity and the second conductivity type is a p-type conductivity. In another embodiment, the first conductivity type is a p-type conductivity and the second conductivity type is an n-type conductivity.

An exemplary method for fabricating a semiconductor device comprising a substrate is also provided. In one embodiment, the method comprises implanting a semiconductor well comprising a first conductivity in the substrate and implanting a first plurality of doped regions comprising a second conductivity in the semiconductor well. Furthermore, the method comprises forming a first area comprising alternating conductivity regions of the first conductivity and the second conductivity in the semiconductor well, wherein the first area comprises alternating regions of the first plurality of doped regions and regions of the semiconductor well.

In accordance with an exemplary embodiment, the method further comprises forming a second area comprising alternating conductivity regions of the first conductivity and the second conductivity in the semiconductor well and implanting a conductivity region in the semiconductor well between the first and second areas. In this embodiment, the second area comprises alternating regions of the first plurality of doped regions and regions of the semiconductor well.

The method, in one embodiment, further comprises forming a silicide layer over at least a portion of the first area. In another embodiment, the method further comprises implanting a second plurality of doped regions comprising the first conductivity in the second semiconductor well, wherein the first area comprises alternating conductivity regions of the first plurality and the second plurality of doped regions.

In one exemplary embodiment, the method further comprises forming a second area comprising alternating conductivity regions of the first conductivity and the second conductivity in the semiconductor well, and implanting a conductivity region in the semiconductor well between the first and second areas. In this embodiment, the second area comprises alternating regions of the first plurality and the second plurality of doped regions. In another embodiment, the method further comprises forming at least one silicided block region in the first area between a first region of the first plurality of doped regions and a second region of the second plurality of doped regions. In yet another embodiment, the method comprises forming a silicide layer over at least a portion of the first area.

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

We claim:

1. A semiconductor device, comprising:
    a semiconductor body comprising a surface;
    a transistor drain located in the semiconductor body proximate the surface;
    a transistor source located in the semiconductor body proximate the surface and spaced apart from the transistor drain, wherein a direction of current flow extends between the transistor drain and the transistor source; and
    a first area comprising multiple p-type regions and multiple n-type regions that are interdigitated with each other in an alternating arrangement and are located in the transistor source at the surface, wherein the p-type regions and n-type regions are interdigitated along a first direction that is perpendicular to the direction of current flow, and the p-type regions and n-type regions have lengths and abutting edges that are parallel with the surface and extend along a second direction that is parallel to the direction of current flow.

2. The semiconductor device of claim 1, the source further comprising a silicide layer covering at least a portion of the first area.

3. The semiconductor device of claim 1, further comprising a second area comprising alternating p-type regions and n-type regions located in the transistor source.

4. The semiconductor device of claim 3, the source further comprising one of a p-type region and an n-type region separating the first area and the second area.

5. The semiconductor of claim 4, further comprising a first polysilicon region adjacent the first area.

6. The semiconductor of claim 5, further comprising a second polysilicon region adjacent the second area.

7. The semiconductor device of claim 4, further comprising at least one source contact located within the one of the p-type region and the n-type region separating the first area and the second area.

8. The semiconductor device of claim 7, wherein the at least one source contact comprises a plurality of source contacts within the one of the p-type region and the n-type region separating the first area and the second area.

9. The semiconductor device of claim 1, further comprising:
 a first polysilicon region located in the transistor source; and
 a second polysilicon region located in the transistor source, the first area separating the first and second polysilicon regions.

10. The semiconductor device of claim 1, wherein the p-type regions and the n-type regions are aligned parallel to one another and interdigitated along a device width direction, while current flow is along a device length direction.

11. The semiconductor device of claim 1, wherein the p-type regions and the n-type regions each have a junction depth in a range of about 0.05 μm to about 0.5 μm.

12. The semiconductor device of claim 1, further comprising a source well formed in the semiconductor body, wherein the p-type regions and the n-type regions are located in the source well.

13. The semiconductor device of claim 1, further comprising at least one source contact located within the first area.

14. The semiconductor device of claim 13, wherein the at least one source contact comprises a plurality of source contacts within a plurality of the p-type regions and the n-type regions.

15. A semiconductor device, comprising:
 a semiconductor body comprising a surface;
 a transistor source located in the semiconductor body proximate the surface; and
 a first area comprising alternating p-type regions and n-type regions located in the transistor source, wherein the first area comprises a silicided block region separating a p-type region from an n-type region.

16. A semiconductor device, comprising:
 a semiconductor body comprising a surface and a first conductivity type;
 a transistor drain located in the semiconductor body proximate the surface;
 a transistor source located in the semiconductor body proximate the surface and spaced apart from the transistor drain, wherein a direction of current flow extends between the transistor drain and the transistor source; and
 a first plurality of regions comprising a second conductivity type located in the transistor source at the surface, the first plurality of regions and the semiconductor body forming a first area of alternating regions of the first and second conductivity types, wherein the alternating regions are interdigitated along a first direction that is perpendicular to the direction of current flow, and the alternating regions have lengths and abutting edges that are parallel with the surface and extend along a second direction that is parallel to the direction of current flow.

17. The semiconductor device of claim 16, further comprising a second plurality of regions comprising the second conductivity type located in the semiconductor body, the second plurality of regions and the semiconductor body forming a second area of alternating regions of the first and second conductivity types.

18. The semiconductor device of claim 17, further comprising a doped region comprising one of the first conductivity type and the second conductivity type separating the first and second areas.

19. The semiconductor device of claim 16, wherein the first conductivity type is an n-type conductivity and the second conductivity type is a p-type conductivity.

20. The semiconductor device of claim 16, wherein the first conductivity type is a p-type conductivity and the second conductivity type is an n-type conductivity.

* * * * *